United States Patent
Chansavang et al.

(10) Patent No.: US 11,137,420 B2
(45) Date of Patent: Oct. 5, 2021

(54) DEVICE FOR MEASURING AT LEAST ONE ELECTRICAL QUANTITY OF A CURRENT FLOWING THROUGH AT LEAST ONE ELECTRICAL DEVICE

(71) Applicant: Schneider Electric Industries SAS, Rueil-Malmaison (FR)

(72) Inventors: Albert Chansavang, Grenoble (FR); Jean-Yves Amblard, Le Gua (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 363 days.

(21) Appl. No.: 16/275,368

(22) Filed: Feb. 14, 2019

(65) Prior Publication Data

US 2019/0265279 A1    Aug. 29, 2019

(30) Foreign Application Priority Data

Feb. 27, 2018 (FR) ..................... 18 51687

(51) Int. Cl.
  *G01R 15/00* (2006.01)
  *G01R 19/00* (2006.01)
  *G01R 22/06* (2006.01)

(52) U.S. Cl.
  CPC ......... *G01R 15/00* (2013.01); *G01R 19/0092* (2013.01); *G01R 22/061* (2013.01); *G01R 22/065* (2013.01)

(58) Field of Classification Search
  CPC .... G01R 15/00; G01R 22/065; G01R 22/061; G01R 19/0092; G01R 19/00; G01R 31/00

(Continued)

(56) References Cited

U.S. PATENT DOCUMENTS

| 8,036,104 B2 * | 10/2011 | Corson | ............... H04L 41/0663 370/217 |
| 8,130,655 B2 * | 3/2012 | Foottit | .................... H04L 47/12 370/236 |

(Continued)

FOREIGN PATENT DOCUMENTS

| EP | 1 736 784 A1 | 12/2006 |
| EP | 2 592 390 A2 | 5/2013 |
| FR | 2 998 674 A1 | 5/2014 |

OTHER PUBLICATIONS

French Preliminary Search Report dated Jan. 16, 2019 in French Application 18 51687, filed on Feb. 27, 2018 (with English translation of categories of Cited Documents and written opinion).

*Primary Examiner* — Christopher P McAndrew
*Assistant Examiner* — Zannatul Ferdous
(74) *Attorney, Agent, or Firm* — Oblon, McClelland, Maier & Neustadt, L.L.P.

(57) ABSTRACT

A system for measuring an electrical quantity of a current circulating in an electrical device mounted on a mounting support, including an electrical power supply device, the device for measuring the current circulating in the device, the device for tapping the voltage at the terminals of the device, and the device for measuring this voltage, device for processing the measurement information, and device for communicating the measurement information to a receiver. This system includes a first main module, including the power supply device, the current and voltage measurement device, the processing device and the communication device, and a second auxiliary module, including the voltage tapping device and electrical connection device connecting with the main module, this connection making it possible to supply voltage to the main module and to measure the voltage recorded by the auxiliary module, the second module including electrical coupling device for connecting to the (Continued)

terminals of the device to be measured, these device being adapted to the configuration of these terminals.

23 Claims, 7 Drawing Sheets

(58) Field of Classification Search
USPC .......................................................... 324/601
See application file for complete search history.

(56) References Cited

U.S. PATENT DOCUMENTS

| 2001/0043062 | A1* | 11/2001 | Reid ...................... G01R 21/06 |
| | | | 324/117 R |
| 2006/0290454 | A1* | 12/2006 | Mas ..................... G01R 15/183 |
| | | | 336/84 R |
| 2009/0164150 | A1* | 6/2009 | Van Maanen ............ G01K 7/42 |
| | | | 702/60 |
| 2015/0300534 | A1* | 10/2015 | Leininger ............ H02G 3/0437 |
| | | | 248/49 |
| 2017/0292987 | A1* | 10/2017 | Leutschacher ......... H02H 9/045 |
| 2018/0180340 | A1* | 6/2018 | Jones .................. H02J 13/0086 |
| 2018/0297544 | A1* | 10/2018 | Bachmann ............ B60R 21/017 |
| 2020/0177232 | A1* | 6/2020 | Miyashita .............. H04B 1/713 |

* cited by examiner

DEVICE FOR MEASURING AT LEAST ONE ELECTRICAL QUANTITY OF A CURRENT FLOWING THROUGH AT LEAST ONE ELECTRICAL DEVICE

TECHNICAL FIELD

The present invention relates to a system for measuring at least one electrical quantity of a current circulating in at least one electrical device mounted on a mounting support, comprising electrical power supply means, means for measuring the current circulating in the device, means for tapping the voltage at the terminals of the device, and means for measuring this voltage, means for processing the measurement information, and means for communicating the measurement information to a receiver.

STATE OF THE ART

A system is known for measuring the energy passing through an electrical device produced by several separate systems respectively performing the communication function, the data processing, the voltage measurement, the current measurement, this implementation in several separate systems making the installation costly, bulky and complex, although it does allow for an adaptation to any product or configuration.

Also known is a measurement and communication system produced via a fully integrated module, making the installation simple and compact. However, this system is only suited to a given terminal configuration, and the measurement accuracy is low.

Also known are measurement systems providing high measurement efficiency in a compact product. However, these products do not adapt to any type of terminal configuration of the products without it being necessary to make modifications to this product.

The present invention resolves these problems and proposes a system for measuring at least one electrical quantity of a current circulating in at least one electrical device, this system, in addition to the fact that it has a certain compactness and good measurement efficiency, also offers enhanced adaptability to the different configurations of terminals of the devices and thus a greater flexibility in the installation thereof.

SUMMARY OF THE INVENTION

To this end, the subject of the present invention is a system for measuring at least one electrical quantity of a current circulating in at least one electrical device, this system being characterized in that it comprises a first, so-called main module, comprising the abovementioned power supply means, the current and voltage measurement means, the processing means and the communication means, and a second, so-called auxiliary module comprising the voltage tapping means and electrical connection means connecting with the so-called main module, this connection making it possible to supply voltage to the main module and to measure the voltage recorded by the auxiliary module, the second module comprising electrical coupling means connecting to the terminals of the device to be measured, these means being adapted to the configuration of these terminals.

According to a particular feature, the abovementioned communication means are wireless communication means.

According to another feature, the abovementioned connection means comprise electrical contact pads provided on the two coupling faces facing one another belonging respectively to the two modules.

According to another embodiment, the abovementioned electrical connection means are of the type allowing the two modules to be used by being separated from one another.

According to another feature, these connection means comprise electrical cables.

According to another feature, this system comprises means for identifying the two modules, the combination of the means for identifying the two modules making it possible to produce the configuration of the product consisting of the association of the two modules.

According to another feature, these identification means comprise electrical contact pads provided on the two facing faces belonging respectively to the two modules, these contact pads being connected to a communication bus making it possible to send an identification frame allowing the configuration between the two modules.

According to another embodiment, these identification means comprise RF or optical link means between the two modules making it possible to send an identification frame allowing the configuration between the two modules.

According to another feature, the main module is identified by one of the features contained in the group comprising the phase type, the rating, and the form of the product.

According to another feature, the auxiliary module is identified by the usage thereof.

According to another feature, the abovementioned auxiliary module comprises guiding means for cables making it possible to facilitate the positioning of these cables inside said auxiliary module, these cables conveying the current in the device to be measured.

According to another feature, the abovementioned auxiliary module comprises means for indicating the service status of the measurement device.

According to another feature, the auxiliary module comprises electrical contacts mounted to translate and/or rotate relative to said auxiliary module so as to adapt to different configurations of terminals of the device to be measured.

According to a particular embodiment, the abovementioned coupling means comprise rigid elements capable of being coupled electrically to the terminals of the device to be measured in a single movement.

According to another embodiment, the abovementioned coupling means comprise coupling cables connecting to the terminals of the device to be measured.

According to another embodiment, the abovementioned auxiliary module is used as an add-on module mounted on a measurement system of conventional one-piece type, which is used as a so-called main module.

According to another embodiment, the main module is equipped with coupling terminals adapted to the configuration of the electrical switchboard in which the energy measurement system is intended to be mounted.

According to a particular feature, this system comprises coding means provided between the two modules making it possible to prevent wrong associations between the two modules.

According to another feature, this system comprises firmware making it possible to establish the behaviour corresponding to the configuration of the product consisting of the association of the two modules.

According to another feature, the first module is placed behind the rail or else inside a lateral cable duct or else inside a horizontal cable duct.

According to another feature, the auxiliary module takes the form of a so-called adaptation plate comprising coupling means adapted to the coupling terminals of the device to be measured.

Advantageously, the device is an electrical protection device.

According to a particular feature, this system is a system for measuring the energy passing through at least one electrical device.

DESCRIPTION OF THE FIGURES

However, other advantages and features of the invention will become more apparent from the following detailed description referring to the attached drawings given purely by way of example and in which.

DETAILED DESCRIPTION OF PARTICULAR EMBODIMENTS

Figure 1:
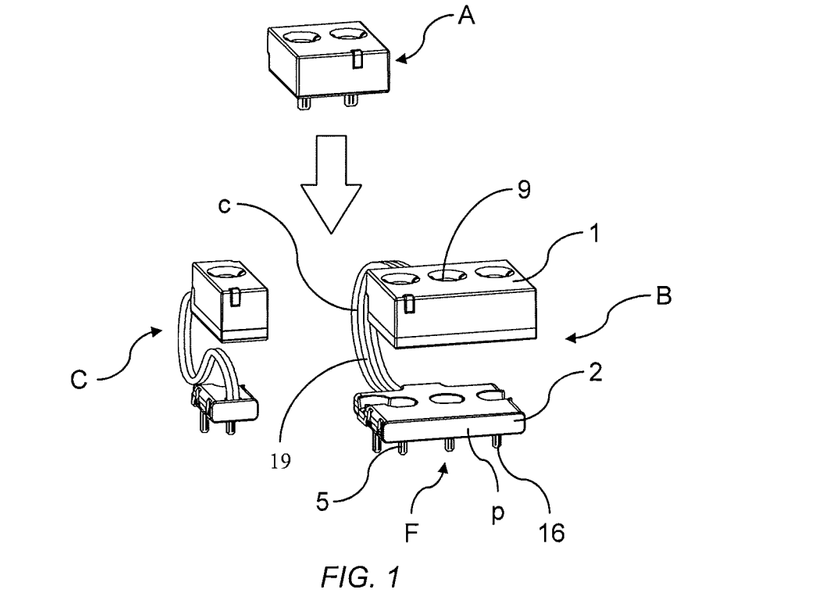
FIG. 1 is a perspective view, illustrating an energy measurement system according to the prior art, and two embodiments of an energy measurement system according to the invention.

In FIG. 1, three electrical energy measurement systems A, B, C can be seen, each system being intended to be associated with an electrical device such as an electrical protection device D, for example a circuit breaker, mounted on a mounting support, in order to measure the electrical energy passing through said device. The first, A, of these systems is an energy measurement system according to the prior art and is housed in a one-piece housing.

The second, B, and the third, C, of these measurement systems are energy measurement systems according to the invention.

According to the invention, the energy measurement system comprises two separate modules 1, 2 intended to be associated with one another and linked electrically to one another. The first, 1, of these modules, the so-called main module, comprises electrical power supply means, current measurement means, data processing means, wireless communication means, for example of Zigbee RF type. The power supply means denote the electronic function ensuring the power supply in the main module. Cables 4 pass through the main module 1 and are intended to convey the current in the device to be measured, for example a circuit breaker.

The second, 2, of these modules, the so-called auxiliary module, comprises so-called voltage tapping means p, intended to tap the voltage at the terminals, for example the upstream terminals 6 of the device to be measured D, and means c for electrically connecting said auxiliary module 2 to the so-called main module 1 in order to supply the latter with voltage and produce the measurement of this voltage, then communicate the measurement information of this voltage and measurement information of the current to an external device.

Figure 11:
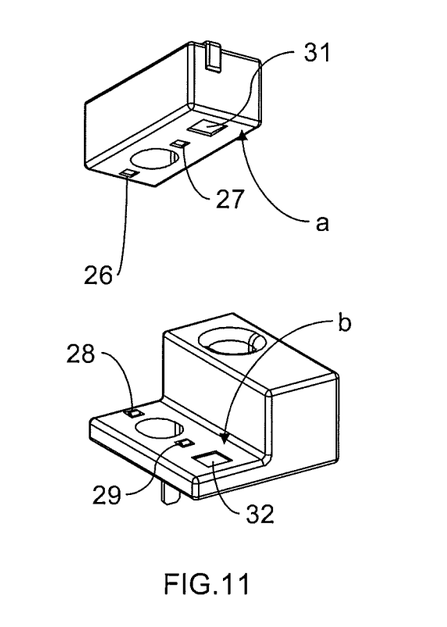
FIG. 11 is a perspective view, illustrating more particularly the two facing faces of two modules constituting a measurement system according to a particular embodiment of the invention.

In order to make the operation of this association of modules possible, two functions are necessary, as is particularly illustrated in FIG. 11. The first of these functions is to ensure the electrical connection between these two modules 1, 2 so as to allow the main module 1 to measure the voltage recorded by the auxiliary module 2. The second, 2, of these functions is to configure these two modules 1, 2 relative to one another via identification means 31, 32 provided between the two modules, these means making it possible to determine, for the two modules, for example, the number of phases, the maximum values of the current and of the voltage, the type of housing, etc.

These identification means 31, 32 can be produced in different ways. One of these ways can consist in providing electrical contact pads on the two facing faces a, b of the two modules, these contact pads being connected or not to a fixed electrical quantity making it possible for example to generate a binary code. For example, two contact pads on each module make it possible to obtain four different codes and therefore four different configurations.

Another solution can consist in providing electrical contact pads 31, 32 connected to a communication bus making it possible to send an identification frame allowing the configuration between the two modules. Another solution could consist in providing the presence of an RF or optical link between the two modules 1, 2 making it possible to send an identification frame allowing the configuration between the two modules.

Figure 3:
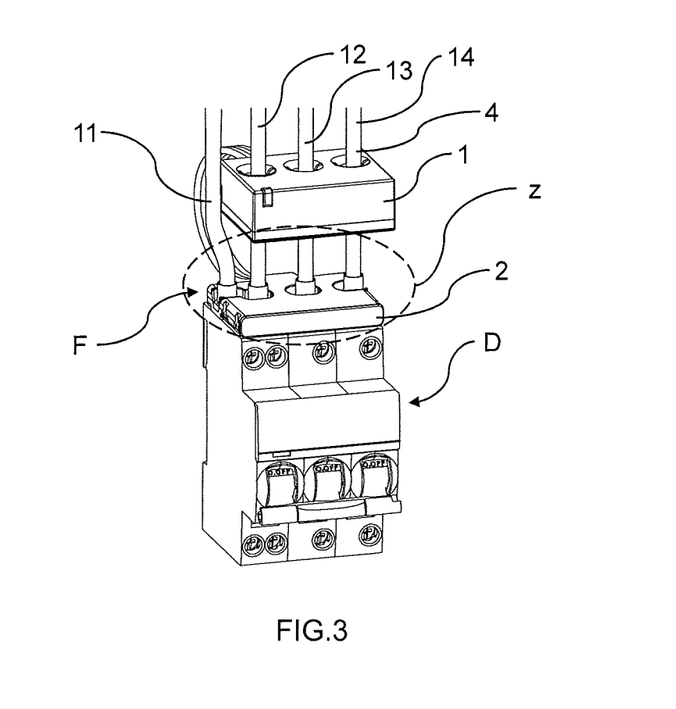
FIG. 3 is a perspective view, illustrating this same measurement system in position of use on the abovementioned electrical device.
Figure 4:
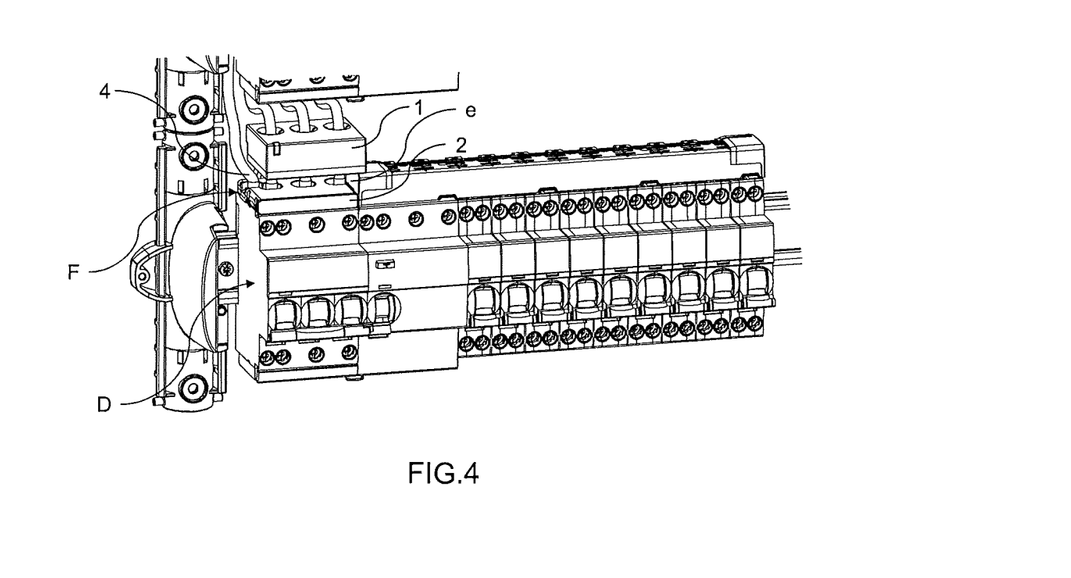
FIG. 4 is a partial perspective view, illustrating this same measurement system used on an electrical device mounted on a mounting rail.

As illustrated in the figures, and more particularly FIGS. 3 and 4, the so-called main module 1 comprises orifices 9 intended to allow the passage of the power conductors 4. These conductors comprise a neutral conductor 11 and three phase conductors 12, 13, 14, and are intended to be linked at one end to an electrical power source, and at the opposite end, respectively, to electrical contacts 16 formed by pins belonging to the second module 2. These electrical contacts 16, or pins 16, are intended to be linked electrically respectively to the different coupling terminals 6 belonging to the electrical device D.

Figure 2:
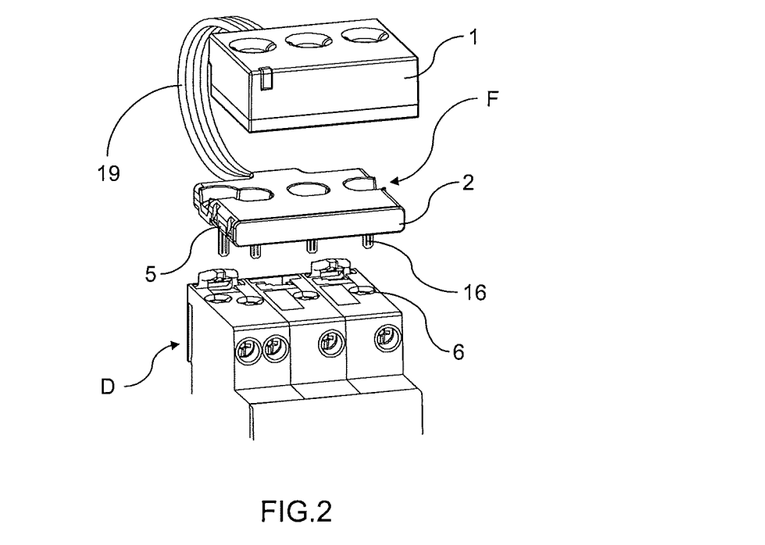
FIG. 2 is a partial perspective view, illustrating the mounting of an energy measurement system according to the invention on an electrical device.

According to the embodiment of the invention described in FIG. 2, these pins 16 are capable of being introduced respectively into the terminals 6 of the device to be measured D, the manoeuvre being performed in a single movement.

According to the invention, the second module 2 is chosen so as to adapt to the configuration and in particular the configuration of the terminals 6 of the device D to be measured. This second module 2 advantageously takes the form of a plate F, the so-called adaptation plate, of small dimension, capable of being superposed on the coupling face of the device to be measured D. This possibility of separating the two modules advantageously makes it possible to free up a space e between the first module 1 and the second module 2, this space making it possible to offer a good visibility relative to the connection zone z of the device to be measured and a good accessibility to this zone when coupling power cables 4 to the device to be measured D.

It will be noted that the two modules 1, 2 are not necessarily located at the same point around the measured device D. If the auxiliary module 2 is always obviously linked to the measured device D, the main module 1 can be displaced by a certain distance, depending on the length of cable between the two modules, relative to the first module at a point where there is more any space available, for example behind a DIN rail, inside a lateral cable duct, inside a horizontal cable duct, etc.

There is thus more space around the measured device to facilitate the coupling.

In some non-bulky switchboard configurations, having a small inter-rail distance and a significant density of wires, the invention can make the installation of an energy measurement system B, C possible at points where it was not previously.

Figure 5:
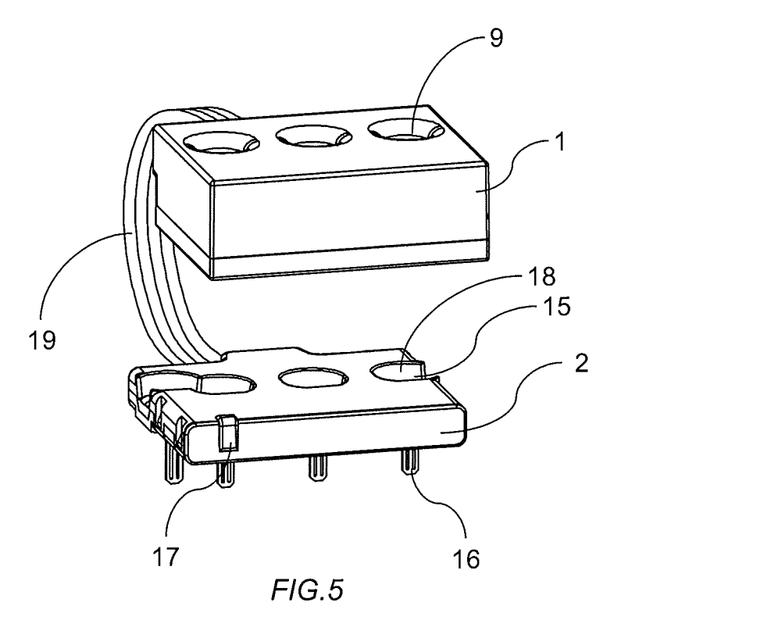
FIG. 5 is a perspective view, illustrating a particular embodiment of the measurement system according to the invention comprising a means for signaling the status of the system.

Advantageously, as illustrated in FIG. 5, the adaptation plate F is equipped with an LED 17 intended to give information on the in-service or out-of-service status of the measurement system or other information coded in the form of different blinking patterns or colours. This makes it possible to ensure that the light information is always visible regardless of where the main module 1 is situated inside the switchboard.

As illustrated in FIGS. 3 to 5, this second module 2 advantageously has guiding means 18 for guiding the power cables 4, these means being formed by the walls of the openings provided in the auxiliary module 2 to receive the cables 4 and leading to the electrical contacts 16 of the module 2.

Thus, the presence of the adaptation plate F is not detrimental to the ergonomics of the coupling of the measured device D. No particular preparation of the wires is necessary for the introduction of these cables 4 into the openings 9.

Advantageously, the electrical connection between the main module 1 and the auxiliary module 2 is made by cables 19. These cables 19 can be round or else flat, a flat cable being easier to manipulate.

Figure 6:
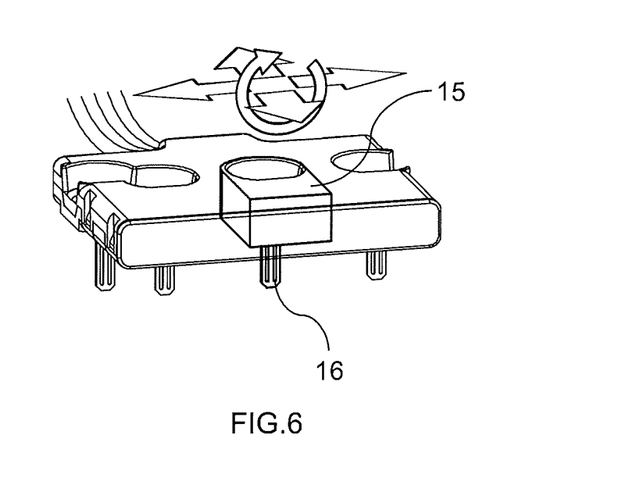
FIG. 6 is a perspective view, illustrating this same system according to another embodiment of the system comprising sliding and rotary electrical contacts.

Advantageously, as illustrated in FIG. 6, the auxiliary module 15 is such that each electrical contact 16 of this adaptation plate F is capable of being displaced in translation or in rotation relative to the plate F so as to adapt to different configurations of coupling terminals 6 of the device D.

Figure 7:
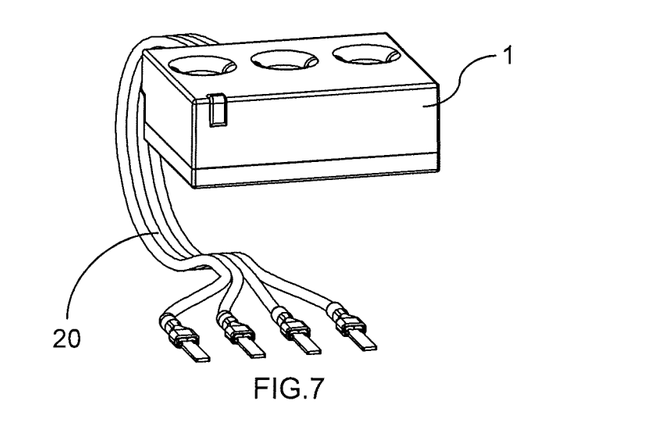
FIG. 7 is a perspective view, illustrating another embodiment of this system.

According to the embodiment illustrated in FIG. 7, the two modules, respectively main 1 and auxiliary 2, form only a single module, and the electrical coupling means 5 connecting the auxiliary module 2 to the terminals 6 of the device D are cables 20. Thus, even if this solution requires more coupling manoeuvres, it makes it possible to adapt to all the configurations.

The end of the wires can thus be left with no particular preparation, leaving the care of equipping it if necessary to the installer, or else be equipped with a flat conductor for example for an easier coupling inside a screw terminal.

Figure 8:
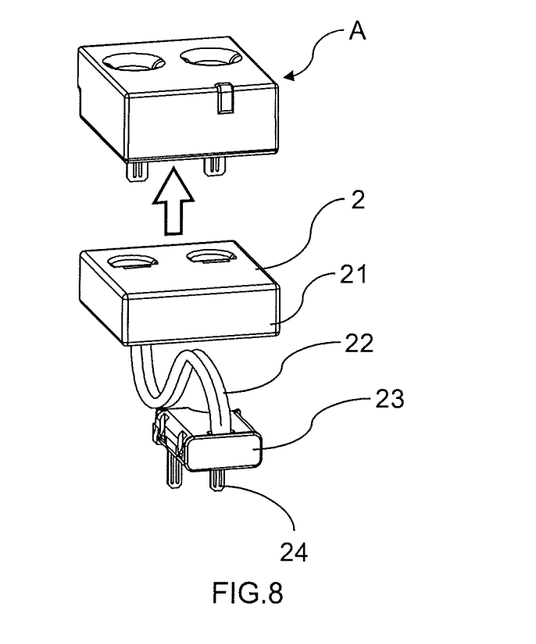
FIG. 8 is a perspective view of another embodiment of the invention in which only a part of this measurement system is used, in combination with a measurement system according to the prior art.

In FIG. 8, a voltage power supply module 2 or auxiliary module according to the invention is designed as an add-on module 21 intended to be associated with an energy measurement system according to the prior art A, said voltage power supply module 2 being linked electrically to the device to be measured D by cables 22 which are themselves linked electrically at one end to the auxiliary module 2, and at the opposite end, to an accessory 23 comprising pins 24 for electrical coupling to the terminals 6 of the device D.

Figure 9:
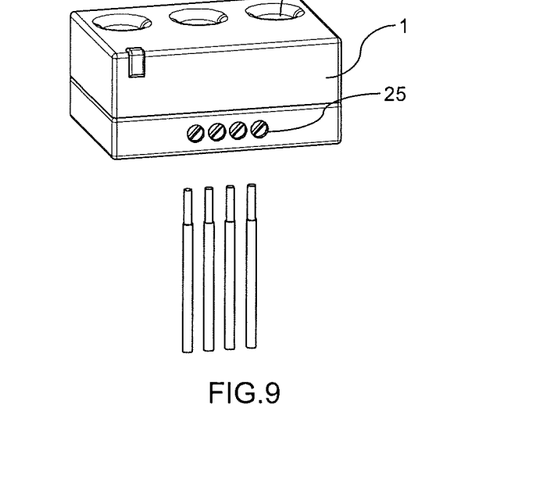
FIG. 9 is a perspective view, illustrating another embodiment of the invention in which the system comprises coupling terminals.

According to the embodiment illustrated in FIG. 9 in which the two modules, respectively main 1 and auxiliary 2, form only a single module, the main module 1 comprises coupling terminals 25 intended to receive one of the ends of wires prepared by the installer himself/herself. These wire ends can be prepared so as to adapt to the coupling configuration of the electrical switchboard in which the device is intended to be mounted, the proposed coupling being able for example to be of the type provided to receive an end part without an insulating part, a flat conductor or of quick connection type.

Figure 10:
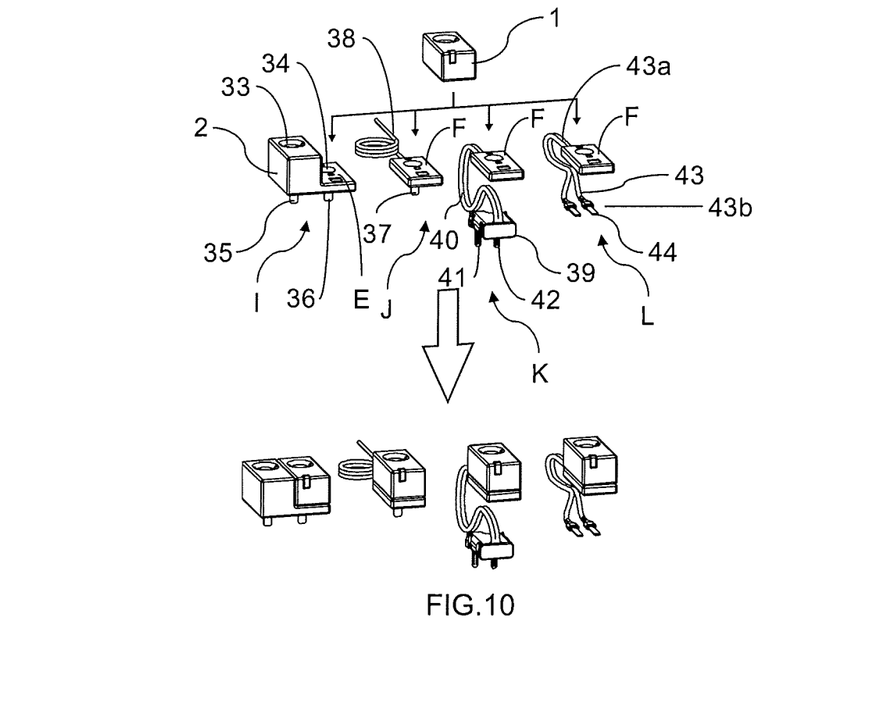
FIG. 10 is a perspective view, illustrating four different embodiments of the measurement system according to the invention, corresponding respectively to four different uses of this system.

FIG. 10 is a perspective view illustrating four different embodiments of an energy measurement system according to the invention.

In all these embodiments, the main module 1 is of the single-phase or single-phase plus neutral type, and is linked electrically to the auxiliary module 2 via two electrical contacts 26, 27 provided on the coupling face of the main module 1, capable of being brought into contact respectively with two electrical contacts 28, 29 provided on the coupling face of the auxiliary module 2, as illustrated in FIG. 11. This FIG. 11 also illustrates the identification means between the two modules 1, 2 allowing the configuration between the two modules, these means being constituted also, in this particular embodiment, via electrical contact pads 31, 32.

The electrical connection between the main module 1 and the auxiliary module 2 allows the supply of voltage to the auxiliary module 2 and thus the measurement of the voltage tapped at the terminals 6 of the device to be measured D.

The configuration of the product after association of the two modules 1, 2 is performed after the identification of the two modules 1, 2. The main module is identified for example by its phase number, its rating, its form, for example, respectively, 1 phase/1 phase plus neutral; 63 A max, 18 mm.

The auxiliary module is identified for example by its usage, for example for a single-pole circuit breaker.

The product configuration is performed by the combination of the data identifying the two modules. This combination of data can be simple, as when it involves electrical protection devices aligned mechanically, or more complex, when the devices to be measured are of the type comprising a communication bus, NFC/RFID for example.

Coding means (not represented) can be provided partly on the main module 1 and partly on the auxiliary module 2 so as to prevent an unwanted association.

This product configuration, once performed, allows firmware to establish the behaviour corresponding to the constructed product configuration.

In this FIG. 10, according to the first embodiment I, the auxiliary module 2 is of the double-pole type and comprises two openings 33, 34 capable of respectively receiving two end parts belonging respectively to two power conductors, so as to allow voltage to be tapped on two terminals of the device to be measured, the electrical coupling with the device to be measured being performed by means of two pins 35, 36 belonging to the auxiliary module 2 and intended to cooperate with the terminals 6 of the device D. However, the housing of this auxiliary module has two parts of different dimensions so as to have a location E capable of receiving the main module 1 so that the assembly of the two joined housings has a substantially parallelepipedal form. Thus, in this type of device, the voltage tapping is performed on the two terminals of the device via the two pins, whereas the measurement of the current is performed only on one of the terminals of the device, the main module 1 comprising only one opening for the passage of a conductor.

According to the second embodiment of the invention J, the auxiliary module 2 has a plate form F comprising a coupling pin 37 connecting to a terminal of a device, and a conductor 38 intended to be linked electrically to the neutral.

According to the third embodiment K, the auxiliary module takes the form of an adaptation plate F linked electrically to a coupling accessory 39 via a cable 40, this accessory 39 comprising two pins 41, 42 for coupling respectively to two terminals belonging to a device to be measured. Thus, in this embodiment, the voltage tapping is performed on the two terminals of the device, whereas the measurement of the current is performed only on a single power conductor.

According to the fourth embodiment, the auxiliary module 2 comprises an adaptation plate F intended to be linked electrically via cables 43 to the device to be measured, these cables 43 comprising an end 43a incorporated in the auxiliary module and an opposite end 43b comprising plug contacts 44 intended to be introduced into the terminals of the device.

In FIG. 11, as indicated previously, the electrical contacts 26, 27 and 28, 29 between the main module 1 and the auxiliary module 2 allow both the supply of voltage to the auxiliary module 2 and the measurement of the voltage at the terminals 6 of the device to be measured D.

Figure 12:
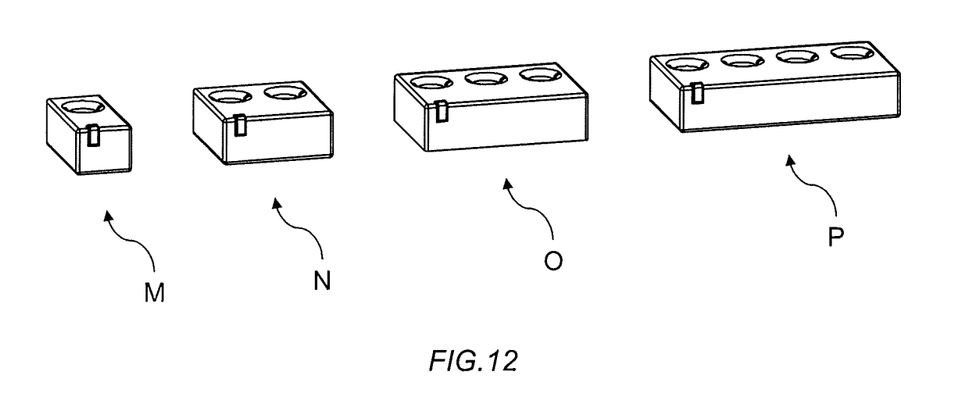
FIG. 12 is a perspective view, illustrating four different embodiments of the first part of the energy measurement system according to the invention.

FIG. 12 illustrates four different embodiments M, N, O, P of the so-called main module 1 corresponding respectively to a module of single-pole or single-pole and neutral type M, to a two-pole module N, to a three-pole, or three-pole and neutral module O, and to a four-pole module P.

The ratings for these four embodiments will respectively for example be: 1-25 A; 10-63 A; 40-100 A; 100-250 A.

The pitches for these different modules will respectively for example be 9 mm, 18 mm, 27 mm and 36 mm.

It will be noted that the two modules 1, 2 can be manipulated separately, given the fact that they are housed in a closed container, and are easy to assemble.

The assembly of the two modules can be locked in order to prevent the consumer from destroying this assembly.

It will also be noted that the auxiliary modules can be ranked according to their uses. From a single main module, a great number of product configurations can be derived.

Figure 13:
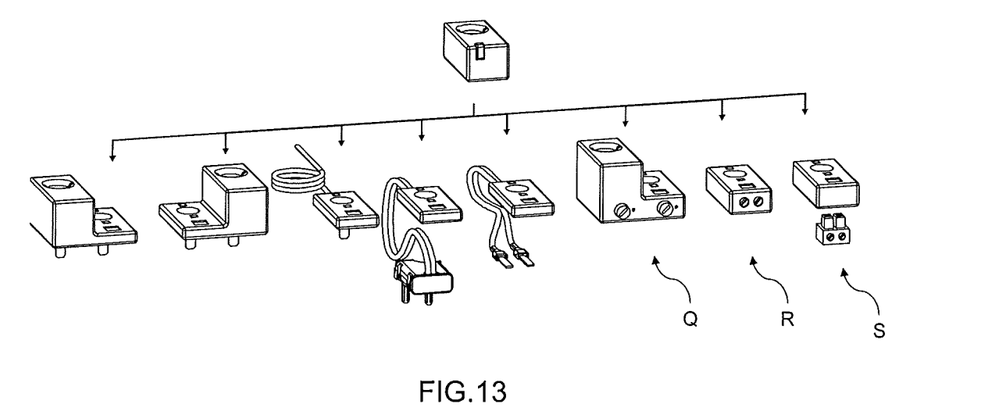
FIGS. 13 and 14 illustrate eight different embodiments of the system according to the invention, respectively before and after the association of the two modules constituting the system.
Figure 14:
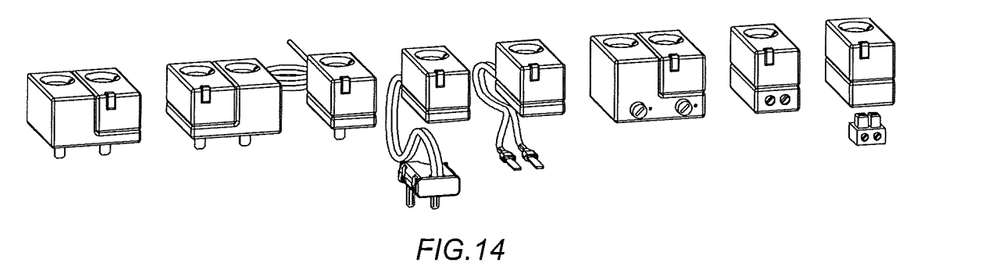

FIGS. 13 and 14 illustrate, in perspective views, several embodiments of the energy measurement system respectively before and after the association of the two modules, these figures representing several embodiments Q, R, S not described in FIG. 10, in which the auxiliary module 2 comprises coupling means independent of the device to be measured, for example of the type with connection by insulation displacement in the power cable, or of the type using a disconnectable terminal block.

There has thus been produced, by virtue of the invention, an electrical energy measurement system having an improved visibility and accessibility in the electrical coupling of the electrical device, so as not to be detrimental to the ergonomics associated with the coupling of the device to be measured.

This is made possible by the fact that this system takes the form of a product in two separate modules, respectively a main module and an auxiliary module, also called the voltage supply module.

These two modules are for example connected electrically to one another by electrical contact pads situated on their coupling faces or else linked electrically by cables, which can for example be of round or flat type.

This auxiliary module is of a sufficiently small size to enhance the visibility and the accessibility of the coupling terminals of the measured device.

The fact that the two modules can be connected electrically by being separated from one another, using any type of electrical connection allowing this, such as a connection by cable or contact pad, makes it possible to increase this visibility and this accessibility. These contact pads or cables are connected to the modules for example by soldering, crimping, screwing or pinning.

The abovementioned ergonomics are further enhanced by the possibility of providing guiding elements on the adaptation plate.

This energy measurement system according to the invention also makes it possible to considerably increase the adaptability to the devices to be measured by the fact that the auxiliary module is designed in the form of a so-called adaptation plate capable of adapting to the configuration of the coupling terminals of the device to be measured, this making it possible to increase the modularity of the system.

Advantageously, the positioning of the electrical connections between the auxiliary module and the device to be measured is performed in a single movement via pins belonging to the auxiliary module and capable of cooperating with the terminals of the device to be measured.

Thus, by virtue of the invention, adaptation to a particular device to be measured requires the choice of a suitable auxiliary module, the main module remaining unchanged. It is therefore no longer necessary to produce a specific complete measurement system, only the auxiliary module needs to be specific.

Another advantage offered by this measurement system according to the invention lies in that it is no longer necessary to prepare the cable ends, as is the case for the system of the prior art requiring the provision for example of a greater length of wire, or else an end-fitting without an insulating ring.

Thus, different auxiliary modules can be associated with a main module in order to create a system specially suited to a specific need.

This multipurpose nature allows the system to be used for multiple uses and different environments. The association of modules can be produced by the consumer and/or on the production line.

The present invention allows for a delayed industrial differentiation or delayed differentiation relative to the client.

The invention therefore makes it possible to provide a simplification over the complexity due to the large number of products and configurations of terminals to which the measurement system must adapt.

Obviously, the invention is not limited to the embodiments described and illustrated which have been given purely by way of example.

On the contrary, the invention comprises all the technical equivalents of the means described and their combinations provided the latter are produced in the spirit thereof.

The invention claimed is:

1. A system for measuring at least one electrical quantity of a current circulating in an electrical device mounted on a mounting support, comprising:
   a main module comprising electrical power supply means, means tier measuring the current circulating in the electrical device, means for measuring a voltage at terminals of the electrical device, processing circuitry configured to process the measured current and voltage, and communication circuitry configured to communicate the measured current and voltage to a receiver, and
   an auxiliary module comprising means for tapping the voltage at the terminals, and electrical connection means for establishing a connection with the main module, the connection allowing voltage to be supplied to the main module and the voltage recorded by the auxiliary module to be measured, the auxiliary module further comprising electrical coupling means connecting to the terminals of the electrical device, the electrical coupling means being adapted to the configuration of said terminals,
   wherein the system further comprises means for identifying a configuration of each of the two modules.

2. The system for measuring at least one electrical quantity according to claim 1, wherein said communication circuitry includes wireless communication circuitry.

3. The system for measuring at least one electrical quantity according to claim 1, wherein the electrical connection means comprise electrical contact pads provided on two coupling faces facing one another and belonging respectively to the two modules.

4. The system for measuring at least one electrical quantity according to claim 1, wherein the electrical connection means are of a type allowing the two modules to be used by being separated from one another.

5. The system for measuring at least one electrical quantity according to claim 4, wherein the electrical connection means comprise electrical cables.

6. The system for measuring at least one electrical quantity according to claim 1, wherein the means for identifying comprise electrical contact pads provided on two facing faces belonging respectively to the two modules, the contact pads being connected to a communication bus so as to send an identification frame allowing identification of the configuration between the two modules.

7. The system for measuring at least one electrical quantity according to claim 1, wherein the means for identifying comprise RF or optical link means between the two modules to send an identification frame allowing identification of the configuration between the two modules.

8. The system for measuring at least one electrical quantity according to claim 1, wherein the main module is identified by one of a plurality of characteristics including a type of phase, rating, and a form of a product.

9. The system for measuring at least one electrical quantity according to claim 1, wherein the auxiliary module is identified by a usage thereof.

10. The system for measuring at least one electrical quantity according to claim 1, wherein the auxiliary module further, comprises guiding means to facilitate positioning of guiding cables inside the auxiliary module, the guiding cables conveying the current in the electrical device.

11. The system for measuring at least one electrical quantity according to claim 1, wherein the auxiliary module further comprises means for indicating a service status of the system.

12. The system for measuring at least one electrical quantity according to claim 1, wherein the auxiliary module further comprises electrical contacts mounted to at least one of translate and rotate relative to the auxiliary module so as to adapt to different configurations of the terminals of the electrical device.

13. The system for measuring at least one electrical quantity according to claim 1, wherein the electrical coupling means comprise rigid elements configured to be coupled electrically to the terminals of the electrical device in a single movement.

14. The system for measuring at least one electrical quantity according to claim 1, wherein the electrical coupling means comprise coupling cables connecting to the terminals of the electrical device.

15. The system for measuring at least one electrical quantity according to claim 1, wherein the auxiliary module is an add-on module mounted on a measurement system of a one-piece type used as the main module.

16. The system for measuring at least one electrical quantity according to claim 1, wherein the main module includes coupling terminals adapted to a configuration of an electrical switchboard inn which the system is mounted.

17. The system for measuring at least one electrical quantity according to claim 1, further comprising coding means provided between the two modules for preventing incorrect associations between the two modules.

18. The system for measuring at least one electrical quantity according to claim 1, further comprising firmware to establish behavior corresponding to a configuration consisting of an association of the two modules.

19. The system for measuring at least one electrical quantity according to claim 1, wherein the main module is placed behind a rail, inside a lateral cable duct, or inside a horizontal cable duct.

20. The system for measuring at least one electrical quantity according to claim 1, wherein the auxiliary module takes a form of an adaptation plate comprising the electrical coupling means adapted to the terminals of the electrical device.

21. The system for measuring at least one electrical quantity according to claim 1, wherein the electrical device is an electrical protection device.

22. The system for measuring at least one electrical quantity according to claim 1, wherein the system is a system for measuring electrical energy passing through the electrical device.

23. A system for measuring at least one electrical quantity of a current circulating in an electrical device mounted on a mounting support, comprising:
   a main module comprising electrical power supply means, means for measuring the current circulating in the electrical device, means for measuring a voltage at terminals of the electrical device, processing circuitry configured to process the measured current and voltage, and communication circuitry configured to communicate the measured current and voltage to a receiver, and an auxiliary module comprising means for tapping the voltage at the terminals and electrical connection means for establishing a connection with the main module, the connection allowing voltage to be supplied to the main module and the voltage recorded by the auxiliary module to be measured, the auxiliary module comprising electrical coupling means connecting to the terminals of the electrical device, the electrical coupling means being adapted to the configuration of said terminals, wherein the auxiliary module takes a form of an adaptation plate comprising the electrical coupling means adapted to the terminals of the electrical device.

\* \* \* \* \*